(12) United States Patent
Takemura et al.

(10) Patent No.: US 7,510,816 B2
(45) Date of Patent: Mar. 31, 2009

(54) SILICON-CONTAINING RESIST COMPOSITION AND PATTERNING PROCESS

(75) Inventors: Katsuya Takemura, Joetsu (JP); Kazumi Noda, Joetsu (JP); Youichi Ohsawa, Joetsu (JP)

(73) Assignee: Shin-Estu Chemical Co., Ltd., Tokyo (JP)

( * ) Notice: Subject to any disclaimer, the term of this patent is extended or adjusted under 35 U.S.C. 154(b) by 350 days.

(21) Appl. No.: 11/242,270

(22) Filed: Oct. 4, 2005

(65) Prior Publication Data

US 2006/0073413 A1    Apr. 6, 2006

(30) Foreign Application Priority Data

Oct. 5, 2004    (JP)    ............... 2004-292290

(51) Int. Cl.
G03C 1/73 (2006.01)
G03F 7/039 (2006.01)
G03F 7/20 (2006.01)
G03F 7/30 (2006.01)
G03F 7/36 (2006.01)

(52) U.S. Cl. ............ 430/270.1; 430/907; 430/905; 430/914; 430/919; 430/921; 430/925; 430/325; 430/326; 430/330; 430/331; 430/311; 430/313

(58) Field of Classification Search ............... None
See application file for complete search history.

(56) References Cited

U.S. PATENT DOCUMENTS

| | | | |
|---|---|---|---|
| 5,972,560 A | 10/1999 | Kaneko et al. | |
| 6,004,724 A | 12/1999 | Yamato et al. | |
| 6,261,738 B1 | 7/2001 | Asakura et al. | |
| 6,309,796 B1 | 10/2001 | Nakashima et al. | |
| 6,730,453 B2 | 5/2004 | Nakashima et al. | |
| 6,908,722 B2 | 6/2005 | Ebata et al. | |
| 2002/0085165 A1 | 7/2002 | Fukumoto et al. | |
| 2003/0170561 A1 | 9/2003 | Iwasawa et al. | |
| 2005/0079443 A1 * | 4/2005 | Noda et al. | ............... 430/270.1 |

FOREIGN PATENT DOCUMENTS

| | | | |
|---|---|---|---|
| JP | 9-95479 A | 4/1997 |
| JP | 9-208554 A | 8/1997 |
| JP | 9-230588 A | 9/1997 |
| JP | 9-301948 A | 11/1997 |
| JP | 10-324748 A | 12/1998 |
| JP | 2906999 B2 | 4/1999 |
| JP | 11-302382 A | 11/1999 |
| JP | 2000-314956 A | 11/2000 |
| JP | 2001-215714 A | 8/2001 |
| JP | 2002-55346 A | 2/2002 |
| JP | 2002-220471 A | 8/2002 |
| JP | 2002-268227 A | 9/2002 |
| JP | 2003-173027 A | 6/2003 |

OTHER PUBLICATIONS

Asakura et al ("Evaluation of a Novel Photoacid generator for Chemically Amplified Photoresist with ArF Exposure", Proceedings of SPIE, vol. 5753, p. 140-148 (2005)).*
Machine-assisted English translation of JP 2002-268227 provided by JPO.*
H. Ito et al., Journal of Photopolymer Science and Technology, vol. 15, No. 4 (2002), pp. 591-602.
J. Photopolymer Science and Technology, vol. 8, No. 1, pp. 43-46 (1995).
J. Photopolymer Science and Technology, vol. 9, No. 1, pp. 29-30 (1996).

* cited by examiner

Primary Examiner—Sin J. Lee
(74) Attorney, Agent, or Firm—Birch, Stewart, Kolasch & Birch, LLP

(57) ABSTRACT

A resist composition is provided comprising a polysiloxane, a specific acid generator, a nitrogen-containing organic compound, and a solvent. The resist composition exerts high-resolution performance without the problem of a T-top profile and is suited for the bilayer resist process using ArF exposure.

6 Claims, No Drawings

SILICON-CONTAINING RESIST COMPOSITION AND PATTERNING PROCESS

CROSS-REFERENCE TO RELATED APPLICATION

This non-provisional application claims priority under 35 U.S.C. §119(a) on Patent application No. 2004-292290 filed in Japan on Oct. 5, 2004, the entire contents of which are hereby incorporated by reference.

This invention relates to a positive resist composition for use in the photolithography, especially the bilayer resist process. More particularly, it relates to a positive resist composition for use in the lithography using deep-ultraviolet, x-ray or electron beam which prevents profile deterioration known as T-top patterning, thus offering a well-defined pattern profile, prevents a pattern from collapsing by swelling, and has good resistance to oxygen gas plasma etching. It also relates to a patterning process using the same.

BACKGROUND OF THE INVENTION

In the drive for higher integration and operating speeds in LSI devices, the pattern rule is made drastically finer. Under the miniaturizing trend, the lithography has achieved formation of finer patterns by using a light source with a shorter wavelength and by a choice of a proper resist composition for the shorter wavelength. Predominant among others are positive resist compositions which are used as a single layer. These single layer positive resist compositions are based on resins possessing a skeleton having resistance to etching with chlorine or fluorine gas plasma and provided with a resist mechanism that exposed areas become dissolvable. Typically, the resist composition is coated on a substrate to be processed and exposed to a pattern of light, after which the exposed areas of the resist coating are dissolved to form a pattern. Then, the substrate can be processed by etching with the remaining resist pattern serving as an etching mask.

In an attempt to achieve a finer feature size, i.e., to reduce the pattern width with the thickness of a resist coating kept unchanged, the resist coating becomes low in resolution performance. If the resist coating is developed with a liquid developer to form a pattern, the so-called "aspect ratio" (depth/width) of the resist pattern becomes too high, resulting in pattern collapse. For this reason, the miniaturization is accompanied by a thickness reduction of the resist coating (thinner coating). On the other hand, with the progress of the exposure wavelength toward a shorter wavelength, the resin in resist compositions is required to have less light absorption at the exposure wavelength. In response to changes from i-line to KrF and to ArF, the resin has made a transition from novolak resins to polyhydroxystyrene and to acrylic resins. Actually, the etching rate under the above-indicated etching conditions has been accelerated. This suggests the inevitableness that a substrate to be processed is etched through a thinner resist coating having weaker etching resistance. It is urgently required to endow the resist coating with etching resistance.

Meanwhile, a process known as multilayer resist process was developed in the art for processing a substrate by etching. The process uses a resist coating which has weak etching resistance under the etching conditions for the substrate, but is capable of forming a finer pattern, and an intermediate coating which has resistance to etching for processing the substrate and can be patterned under the conditions to which the resist coating is resistant. Once the resist pattern is transferred to the intermediate coating, the substrate is processed by etching through the pattern-transferred intermediate coating as an etching mask. A typical process uses a silicon-containing resin as the resist composition and an aromatic resin as the intermediate coating. In this process, after a pattern is formed in the silicon-containing resin, oxygen-reactive ion etching is carried out. Then the silicon-containing resin is converted to silicon oxide having high resistance to oxygen plasma etching, and at the same time, the aromatic resin is readily etched away where the etching mask of silicon oxide is absent, whereby the pattern of the silicon-containing resin is transferred to the aromatic resin layer. Unlike the single layer resist coating, the aromatic resin need not have light transmittance at all, allowing for use of a wide variety of aromatic resins having high resistance to etching with fluorine or chlorine gas plasma. Using the aromatic resin as the etching mask, the substrate to be processed can be etched with fluorine or chlorine gas plasma.

With respect to the bilayer resist process, active studies were made on the exposure to the radiation (193 nm) of ArF excimer laser and radiation of shorter wavelength where aromatic resins can be no longer used, and several reports have already been made. For example, JP-A 10-324748 and JP-A 11-302382 disclose a siloxane polymer having carboxyl group-containing, non-aromatic monocyclic or polycyclic hydrocarbon groups or bridged cyclic hydrocarbon groups on side chains wherein at least some of the carboxyl groups are substituted with acid labile groups, for example, a siloxane polymer in which a norbornyl group having a t-butoxycarbonyl group at 5-position is bonded to a silicon atom, and a resist composition comprising the polymer. Allegedly this resist composition is less absorptive to KrF (248 nm) excimer laser or ArF excimer laser radiation, forms a pattern of good profile, and is improved in sensitivity, resolution and dry etching resistance. Also, JP-A 2002-055346 and JP-A 2002-268227 disclose that silicone-containing polymers having fluorinated alcohol incorporated therein are less absorptive at the wavelength (157 nm) of $F_2$ laser and improved in sensitivity, resolution and plasma etching resistance.

For the technology intended to improve resolution by reducing the wavelength of an exposure light source, there have been reported compositions using fluorinated siloxane polymers having less absorption at the exposure wavelength of $F_2$ laser. For example, JP-A 2002-220471 discloses that a radiation-sensitive resin composition comprising a polysiloxane having a specific acid-assisted leaving group linked to a silicon atom via at least two bicyclo[2.2.1]heptane rings is useful in that it is improved in dry etching resistance and highly transparent to the radiation of $F_2$ laser. With respect to the technique of improving resolution by forming a thinner coating of material, JP-A 2001-215714 discloses that a silicon-containing polymer having a viscosity in a specific range enables to form a thinner resist coating while maintaining in-plane uniformity in the resist coating.

As the pattern is reduced in feature size, the resist film becomes thinner. For silicone-containing resist compositions allowing film thickness to be reduced, only a limited range of acid generators can be selected to comply with the post-ArF progress toward shorter wavelength. Although a wide variety of acid generators are disclosed in the above-referred patents, the acid generators which are used in post-ArF resist compositions are generally onium salts, and in fact, most examples reported therein use sulfonium salts and iodonium salts. One of the reasons why onium salts are preferentially employed in post-ArF resist compositions is their sensitivity. If organic acid generators other than onium salts are compounded in post-ArF resist compositions, no appropriate sensitivity is achievable. This causes the lithographic process of pattern formation to require an increased exposure dose, resulting in reduced throughputs. The extremely low sensitivity makes it impossible to resolve the pattern to the desired fine feature size.

However, when onium salts are used in silicone based resist compositions as an acid generator, the resist compositions tend to form a pattern with a T-top profile that the top of the pattern becomes extended or overhung because the onium salts have an outstanding dissolution inhibitory effect. Particularly when a silicone-containing polymer having fluorinated alcohol introduced therein is used and an onium salt is used as an acid generator, a T-top profile is often observable. The pattern to be formed by lithography should most preferably maintain rectangularity whereas the T-top profile leads to a failure to form the desired pattern in the etching step following the development. Also, the T-top profile degrades the depth of focus (DOF) in the lithographic process and compromises the minimum resolution ability. For these reasons, the T-top profile should be avoided.

Also on use of onium salts as an acid generator, yet due to the outstanding dissolution inhibitory effect, patterning on a substrate having a high reflectivity results in a pattern profile having standing waves. The generation of standing waves should also be avoided because they can adversely affect the control of pattern size.

Accordingly, in connection with silicone-containing resist compositions which are suited for film thickness reduction, there is an urgent need for a composition which forms a pattern profile with high rectangularity, avoids any loss of dimensional control by the generation of standing waves in a pattern, and has an ability to form a smooth profile.

Among the recent studies on single layer resist coatings where attempts were made to form a finer pattern, it was reported as the cause of pattern collapse that the polymer undergoes substantial swelling immediately before dissolution during development, which inhibits formation of a finer pattern. One effective measure for preventing such swell is to introduce a unit containing a hydroxyl group having an adequately increased acidity due to fluorine substitution at proximate positions, into a resin as a polar group. See H. Ito et al., Journal of Photopolymer Science and Technology, Vol. 15, No. 4 (2002), 591-602. The pattern collapse is a common problem to a silicon-containing resist composition comprising a silicone resin as a base polymer. There is a possibility that the high resolution of the aforementioned polysiloxane polymer be accompanied by this effect.

However, in an actual practice, an attempt to transfer a pattern to an aromatic resin organic coating using a fluorine-rich resin as an etching mask revealed that its resistance to oxygen-reactive etching is far below the expectation. There is a need for further improvement in resistance to etching under these conditions.

DISCLOSURE OF THE INVENTION

An object of the present invention is to provide a silicone resin-containing resist composition for the bilayer process which enables to form a finer pattern by minimizing the pattern collapse by swelling, which has a high resolution performance enough to form a pattern profile with high rectangularity without generating a T-top profile, and which exhibits improved resistance to the etching used in the pattern transfer to an underlying organic film; and a patterning process using the resist composition.

The inventors have found that a resist composition having a high resolution performance enough to form a pattern profile by lithography without generating a T-top profile and acceptable resistance to the etching conditions associated with an aromatic organic film is obtainable by introducing into a silicone resin constituting a resist composition, three structural units: a carboxylic acid protected with an acid labile group for acquiring a high dissolution contrast for affording a high resolution, a hydroxyl group with fluorine substitution at proximate positions for preventing swelling, and a lactone structure for establishing swelling prevention and preventing the etching resistance from lowering and especially, a lactone structure having a five or six-membered ring skeleton, and using a specific organic acid generator other than onium salts.

In one aspect, the present invention provides a resist composition comprising (A) a polysiloxane comprising structural units having the following general formulae (1), (2) and (3):

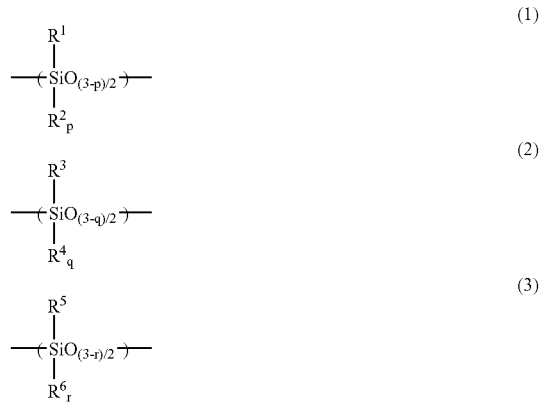

wherein $R^1$ is a $C_3$-$C_{20}$ organic group with a straight, branched, cyclic or polycyclic structure which has a hydroxyl group on a carbon atom as a functional group, which has at least 3 fluorine atoms, in total, on a carbon atom bonded to the hydroxyl-bonded carbon atom, and which may further contain a halogen, oxygen or sulfur atom, $R^2$ is a $C_1$-$C_6$ hydrocarbon group with a straight, branched or cyclic structure, $R^3$ is an $C_3$-$C_{20}$ organic group with a straight, branched, cyclic or polycyclic structure which has a carboxyl group as a functional group, said carboxyl group being protected with an acid-decomposable protecting group, and which may further contain a halogen, oxygen or sulfur atom, $R^4$ is as defined for $R^2$, $R^5$ is a $C_4$-$C_{16}$ organic group which has a lactone ring as a functional group and which may further contain a halogen, oxygen or sulfur atom, $R^6$ is as defined for $R^2$, p is 0 or 1, q is 0 or 1, r is 0 or 1, (B) an acid generator having the structural formula (4):

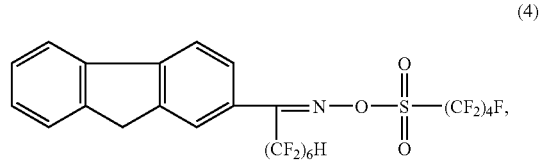

(C) a nitrogen-containing organic compound, and
(D) a solvent.

In the polysiloxane (A), the structural units having formula (1) are preferably structural units having the following formula (5).

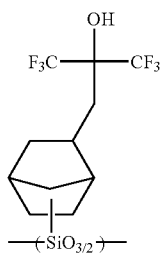

(5)

Also in the polysiloxane (A), the structural units having formula (2) are preferably structural units having the following formula (6).

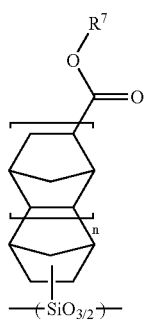

(6)

Herein $R^7$ is an acid labile group and n is an integer of 0 or 1.

In the structural units having formula (3) constituting the polysiloxane (A), preferably $R^5$ has a cycloaliphatic structure and a five-membered lactone structure bonded thereto, with the silicon atom being bonded to one of carbon atoms within the cycloaliphatic structure.

In the polysiloxane (A), the structural units having formula (3) are preferably structural units having the following formula (7) or (8).

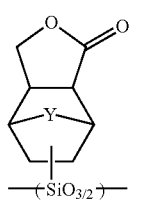

(7)

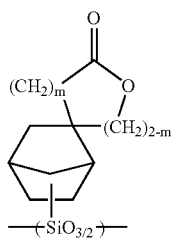

(8)

Herein Y is an oxygen atom, sulfur atom or methylene group and m is 0 or 1.

In another aspect, the present invention provides a patterning process comprising the steps of applying the resist composition defined above onto a substrate to form a resist layer, heat treating the resist layer and exposing it to a pattern of high energy radiation, and heat treating the exposed resist layer and developing it with a developer. In a preferred embodiment, the patterning process may further involve forming a resin layer on the substrate such that the resin layer is sandwiched between the substrate and the resist layer, said resin layer comprising an aromatic resin having etching resistance when the substrate is to be etched.

In a further aspect, the present invention provides a patterning process comprising the steps of forming a pattern on a resin film comprising an aromatic resin, using the resist composition defined above, and etching the resin film through the resulting pattern as a mask, thereby patterning the resin film. In a preferred embodiment, the etching step uses a gas plasma containing oxygen.

The resist composition of the invention uses a silicone polymer which is amenable to film thickness reduction in a lithographic process involving exposure to ArF or later, i.e., wavelength 193 nm or shorter and which provides a sufficient etching selection ratio relative to an underlying film of organic material in oxygen reactive etching. It has a high resolution performance enough to form a pattern profile without generating a T-top profile. It is especially suited for the bilayer process involving ArF exposure.

It is noted that the phrase "$C_3$-$C_{20}$" as used herein, for example, is a carbon number range ranging from 3 to 20.

DESCRIPTION OF THE PREFERRED EMBODIMENTS

The resist composition of the present invention is defined as comprising
(A) a polysiloxane compound,
(B) an acid generator,
(C) a nitrogen-containing organic compound, and
(D) a solvent.

The polysiloxane compound (A) in the resist composition comprises structural units having the following general formulae (1) and (2) and further structural units having the following general formula (3) as a third.

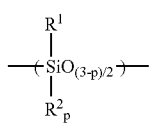

(1)

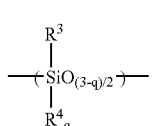

(2)

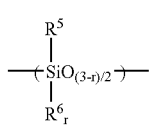

(3)

Herein $R^1$ is a $C_3$-$C_{20}$ organic group with a straight, branched, cyclic or polycyclic structure which has a hydroxyl group on a carbon atom as a functional group, which has at least 3 fluorine atoms, in total, on a carbon atom bonded to the hydroxyl-bonded carbon atom, and which may contain one or more halogen, oxygen or sulfur atom in addition to the fluorine atoms, $R^2$ is a $C_1$-$C_6$ hydrocarbon group with a straight, branched or cyclic structure. $R^3$ is an $C_3$-$C_{20}$ organic group with a straight, branched, cyclic or polycyclic structure which has a carboxyl group as a functional group, the carboxyl group being protected with an acid-decomposable protecting group, and which may contain one or more halogen, oxygen or sulfur atom in addition to the carboxyl group, $R^4$ is as defined for $R^2$. $R^5$ is a $C_4$-$C_{16}$ organic group which has a lactone ring as a functional group and which may contain one or more halogen, oxygen or sulfur atom in addition to the lactone ring, $R^6$ is as defined for $R^2$. The subscript p is 0 or 1, q is 0 or 1, and r is 0 or 1.

The unit having formula (1) is incorporated as a structural unit having a polar group capable of controlling swell. It contributes to this effect that unlike ordinary alcohols, the hydroxyl group on $R^1$ affords an adequate acidity because the density of electrons on oxygen is reduced due to the strong attraction of electrons by fluorine atoms bonded at proximate positions. Fluorine atoms exert a substantial electron attracting effect when they are bonded to a carbon atom which is bonded to the hydroxyl-bonded carbon atom, but less such effect when bonded at a remoter position. To acquire this effect more efficiently, it is preferred to attach a trifluoromethyl group(s) to the hydroxyl-bonded carbon atom. A typical partial structure is hexafluoroisopropyl group. A number of such fluorine-substituted alcohol derivatives have already been reported. A silicone structural unit can be obtained by effecting hydrosilylation between such an alcohol derivative having an unsaturated bond and a SiH group-containing silane to form a silane monomer, followed by hydrolytic condensation. The skeleton of substituent group forming the side chain is a $C_3$-$C_{20}$ organic group with a straight, branched, cyclic or polycyclic structure which may contain a halogen, oxygen or sulfur atom(s). Several of fluorinated silicone compounds having a hydroxyl group have already been disclosed (e.g., in JP-A 2002-268227 and JP-A 2003-173027) and they all can be generally used herein. Of the structural units belonging to this genus, a choice of a single unit may be made or a mixture of two or more different units may be used. Of these units, use of a structural unit having a norbornane skeleton is advantageous in purification or the like because the resulting resin is most likely solid. Some typical examples are given below.

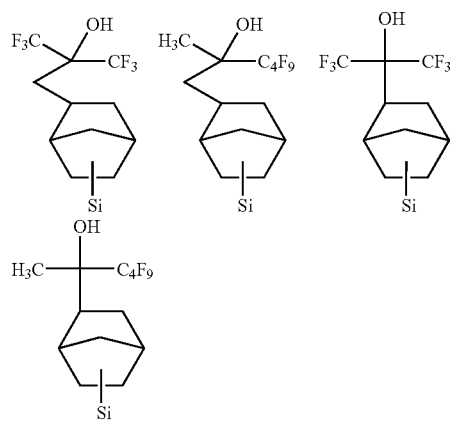

Of the structural units having formula (1), polysiloxane compounds having the following formula (5) are preferred.

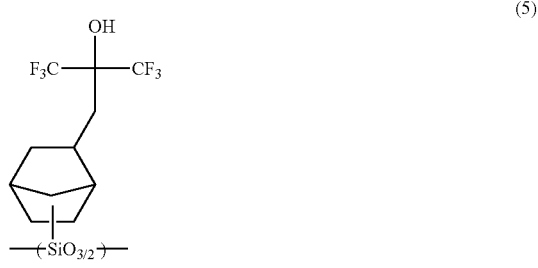

(5)

In the structural unit having formula (2), $R^3$ is a side chain having carboxylic acid protected with an acid labile group (i.e., carboxyl group protected with an acid-decomposable protecting group), which functions to establish differential dissolution between exposed and unexposed areas. The acid labile group is a technical term generally used in the resist-related art. The acid labile group with which a functional group is protected functions such that when a strong acid is generated from a photoacid generator upon exposure, the bond between the acid labile group and the functional group is scissored under the catalysis of the strong acid. As a result of scission, carboxylic acid is regenerated herein. The protecting group used herein may be any of well-known groups. When carboxylic acid is to be protected, the preferred protecting groups are $C_4$-$C_{20}$ tertiary alkyl groups, $C_3$-$C_{18}$ trialkylsilyl groups, and $C_4$-$C_{20}$ oxoalkyl groups. Of the tertiary alkyl groups, those tertiary alkyl groups in which substituent groups on a tertiary carbon atom are substituted so as to form a 5- to 7-membered ring with that tertiary carbon and those tertiary alkyl groups in which a carbon chain bonded to a tertiary carbon atom has a branched or cyclic structure are most preferred because they afford high resolution.

The side chain bearing carboxylic acid to be protected is a $C_3$-$C_{20}$ organic group with a straight, branched, cyclic or polycyclic structure which may contain a halogen, oxygen or sulfur atom(s). As in the previous case, this is also readily obtainable by effecting hydrosilylation of a protected carboxylic acid derivative having an unsaturated carbon bond with an SiH group-containing silane to form a silicone monomer, followed by hydrolytic condensation. Of these, those monomers in which both silicon and a protected carboxyl group are in direct bond with a norbornane ring or tetracyclododecene ring are most preferred because they afford high resolution. Of the structural units having formula (2), those having the following formula (6) are preferred.

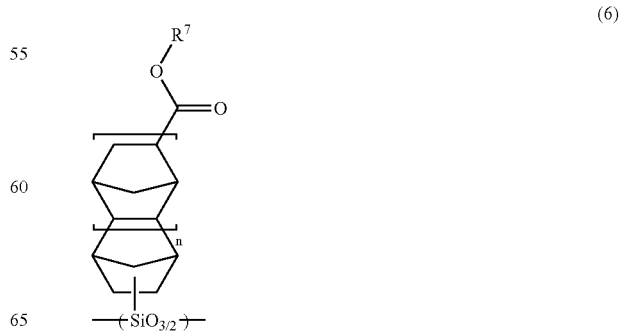

(6)

Herein $R^7$ is an acid labile group, and n is an integer of 0 or 1.

Preferred examples of the acid labile group represented by $R^7$ are given below.

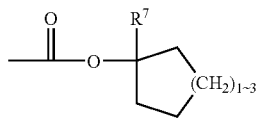

$R^7$: $C_1$–$C_6$ straight, branched or cyclic alkyl

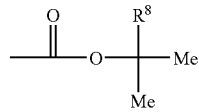

$R^8$: $C_2$–$C_6$ straight, branched or cyclic alkyl, norbornyl or adamantyl
Me: methyl

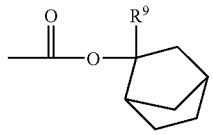

$R^9$: $C_1$–$C_6$ straight or branched alkyl

Like the unit of formula (1), for the unit of formula (2), a single unit or a mixture of different units belonging to this genus may be used.

The unit of formula (3) ensures that the silicone resin has a necessary polarity and serves as a second polar group functioning to reduce the necessary quantity of the unit of formula (2). With respect to the polar group, a number of polar groups including hydroxy, carbonyloxyalkyl, carboxyl and carbonate groups have already been disclosed. An actual attempt to combine the unit of formula (1) with the unit of formula (2) failed to provide such an effect as exerted by acrylic acid polymers for the single layer use, that is, failed to provide high resolution. By contrast, the additional use of the lactone skeleton-bearing unit having formula (3) is successful in establishing both polarity and high resolution.

The silicone structure having a lactone skeleton which have been reported include those structures having lactone incorporated in a cyclic structure, those structures having a linker, and those structures in which lactone is linked to a cyclic structure via a linker (see JP-A 2002-268227). Of these, the structural units having a cycloaliphatic skeleton and further a five-membered lactone skeleton bonded thereto, and having a side chain in which a silicon atom is bonded to one of carbon atoms within the cycloaliphatic skeleton are most preferred because the highest resolution is accomplished.

Two structural units affording the best resolution are illustrated below.

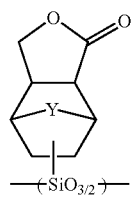

(7)

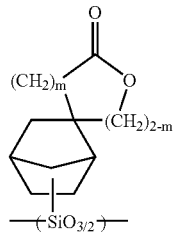

(8)

Herein Y is an oxygen atom, sulfur atom or methylene group, and m is 0 or 1.

Of the above-illustrated compounds of the general formula (7), those compounds wherein Y is oxygen are more preferred for use in the inventive composition because of a more polar effect. Of the above-illustrated compounds of the general formula (5), those compounds wherein m is 0 and those compounds wherein m is 1 may be used alone or in admixture.

Like the units of formulae (1) and (2), for the unit of formula (3), a single unit or a mixture of different units belonging to this genus may be used.

The structural units having formulae (1), (2) and (3) may be either divalent structural units or trivalent silicone compounds. The situation where p, q or r is 0 means trivalent and the situation where p, q or r is 1 means divalent. When divalent structural units account for 50 mol % or more based on the entire structural units of formulae (1), (2) and (3), a silicone resin resulting from condensation of these monomers is unlikely to solidify and thus difficult to purify. Thus, divalent structural units are preferably included in an amount of less than 50 mol %, more preferably equal to or less than 20 mol %, even more preferably equal to or less than 10 mol %.

When the divalent monomer is used, the other side chain $R^2$, $R^4$ or $R^6$ from silicon may be selected from simple groups because no particular function is assigned thereto. Since a carbon number in excess of 6 tends to interfere with purification by distillation or the like, a choice is preferably made of hydrocarbon groups having not more than 6 carbon atoms.

With respect to the proportion of structural units having formulae (1), (2) and (3), first of all, the ratio of the structural unit of formula (2) to the entire silicone structural units is determined because a dissolution contrast between exposed and unexposed areas of a resist coating is almost dictated by this ratio. The ratio of the structural unit of formula (2) is preferably 5 to 80 mol %, more preferably 10 to 50 mol %, based on the entire polysiloxane compound although it varies somewhat with the molecular weight of the protecting group or the like.

Next, the total amount of polar groups, that is, the total amount of the structural units of formulae (1) and (3) is preferably 20 to 95 mol %, more preferably 50 to 90 mol %, based on the entire polysiloxane compound. If these units are in short, the resist pattern can collapse by peeling and swelling during development. If these units are in excess, the resist coating may have a lower contrast and lower resolution.

With respect to the ratio of the structural unit of formula (1) to the structural unit of formula (3), if one structural unit is less than 10 mol % based on the total of these two structural units, the function of the one structural unit is not available. It is thus preferred that each structural unit be 10 to 90 mol % based on the total of structural units of formulae (1) and (3).

Further, divalent or more siloxane units other than the structural units of formulae (1) to (3) may be added as long as their amount is at most 30 mol % of the entire polysiloxane compound. For example, where every siloxane structural unit has a bulky side chain, in some cases, only a compound with a lower molecular weight can be obtained through mere adjustment of condensation conditions for polysiloxane synthesis. In such cases, the molecular weight can be increased by adding units having only an alkyl group of at most 4 carbon atoms, typically methylsiloxane. Also, where it is desired to enhance the transparency of a resin to exposure light of shorter wavelength, typically light of 157 nm, it is known effective to increase the number of fluorine atoms contained in the resin per unit weight. For imparting such transparency to the resist of the invention, it is effective to introduce siloxane units having fluoroalkyl groups introduced therein other than the structural units of formula (1).

These siloxane structure units can be synthesized by cohydrolytic condensation of a mixture of hydrolyzable silane compounds corresponding to the respective units, i.e., by contacting with water a mixture of silane monomers having the following formulae (1a) to (3a):

$R^1R^2_p SiX_{3-p}$ (1a)

$R^3R^4_q SiX_{3-q}$ (2a)

$R^5R^6_r SiX_{3-r}$ (3a)

wherein $R^1$ to $R^6$, p, q and r are as defined above, X is a hydrolyzable group such as a hydrogen atom, chlorine atom, bromine atom, or straight, branched or cyclic $C_1$-$C_6$ alkoxy group. The reaction may be effected in the presence of an acid catalyst or base catalyst and also in an organic solvent. Examples of suitable acid catalysts used in the reaction include hydrochloric acid, nitric acid, acetic acid, oxalic acid, sulfuric acid, methanesulfonic acid, p-toluenesulfonic acid, trifluoroacetic acid, trifluoromethanesulfonic acid, perchloric acid, phosphoric acid and citric acid. Examples of suitable base catalysts include ammonia, methylamine, dimethylamine, ethylamine, diethylamine, triethylamine, sodium hydroxide, potassium hydroxide, tetramethylammonium hydroxide, tetrapropylammonium hydroxide, choline, diethylhydroxylamine, DBU, and DBN. Suitable organic solvents include polar solvents such as ethanol, IPA, MIBK, acetonitrile, DMA, and DMF, and aromatic solvents such as benzene, toluene, and xylene, which may be used alone or in admixture.

The silicone resin or polysiloxane compound produced as the cohydrolytic condensate of a mixture of silane monomers (1a) to (3a) should preferably have a weight average molecular weight (Mw) of 1,000 to 100,000, more preferably 1,000 to 30,000, and even more preferably 1,500 to 20,000, as measured by gel permeation chromatography (GPC) versus polystyrene standards. Resins having a Mw in excess of 100,000 may be difficult to purify, resins having a Mw in excess of 30,000 tend to decline in resolution, though depending on a combination of monomers, and resins having a Mw in excess of 20,000 may have similar tendency. Resins having a Mw of less than 1,500 tend to have a rounded pattern profile, and resins having a Mw of less than 1,000 may have more tendency. During subsequent etching of the underlying film, such a rounded pattern profile can cause to prevent perpendicular etching of the film.

Component (B) in the resist composition of the invention is an acid generator. When a resist coating is formed from a resist composition and exposed to a pattern of light, the acid generator in the resist composition functions to generate an acid upon receipt of the energy of the light. In a resist coating made of the inventive resist composition, the acid thus generated serves as a catalyst to act on the acid-decomposable protecting group of the protected carboxyl group as the silicone resin side chain, scissoring off the protecting group and rendering the carboxyl group free and thus turning the silicone resin to be dissolvable in an aqueous alkaline developer. With respect to the acid generator, a number of technical reports have already been made in conjunction with non-silicone resist compositions. For example, JP-A 2004-149754 describes numerous exemplary acid generators. Basically, all such known acid generators are applicable to the present invention. In the resist composition of the invention, however, an acid generator having the following formula (4) is essentially included.

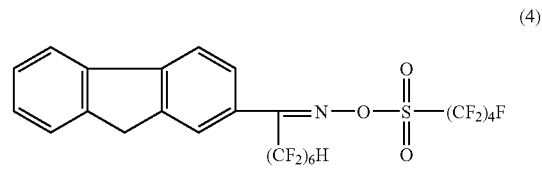

(4)

The organic acid generator of formula (4) has a high sensitivity even when used alone and takes to the full extent the advantage of organic acid generators that pattern side walls can be smoothly finished without generating a T-top profile. In the silicone-containing resist composition, the compound of formula (4) serves as an organic acid generator very effectively.

Although the organic acid generator of formula (4) is effective even when used alone, it may be used in combination with any organic acid generator of different type.

More particularly, as discussed above, when ordinary onium salts are used alone as a sole acid generator in silicone based resist compositions, the resist compositions tend to form a pattern with a T-top profile that the top of the pattern becomes extended or overhung because the onium salts have an outstanding dissolution inhibitory effect. Particularly when a silicone-containing polymer having fluorinated alcohol introduced therein is used and an onium salt is used as a sole acid generator, a T-top profile is often observable. The pattern to be formed by lithography should most preferably maintain rectangularity whereas the T-top profile leads to a failure to form the desired pattern in the etching step following the development. Also, the T-top profile degrades the depth of focus (DOF) in the lithographic process and compromises the minimum resolution ability. For these reasons, the T-top profile should be avoided. Also on use of onium salts as an acid generator, yet due to their outstanding dissolution inhibitory effect, patterning on a substrate having a high reflectivity results in a pattern profile having standing waves. The generation of standing waves should also be avoided because they can adversely affect the control of pattern size.

One of the effects that are expected to be achieved when organic acid generators other than the onium salts are used is that side walls of a resist pattern profile are finished very smoothly. Unlike the onium salts, these organic acid generators have no noticeable dissolution inhibitory effect, eliminating any concern about standing waves.

Typical organic acid generators other than the onium salts are N-sulfonyloxyimide photoacid generators which include, but are not limited to, combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, and methanesulfonate. Of these, 5-norbornene-2,3-dicarboxylic acid imide nonafluorobutane-sulfonate was used in the art as one of acid generators having an appropriate sensitivity in ArF exposure, but the inventors have found that it tends to produce a pattern with T-top profile, like onium salts, when used alone in silicone-containing resist compositions.

Listed below are organic acid generators which are not recommended to be used alone because they do not have an appropriate sensitivity in the post-ArF lithography.

Exemplary sulfonyldiazomethane compounds include alkyl-substituted sulfonyldiazomethane compounds such as bis(1,1-dimethylethylsulfonyl)diazomethane and bis(cyclohexylsulfonyl)diazomethane;
fluoroalkyl-substituted sulfonyldiazomethane compounds such as bis(perfluoroisopropylsulfonyl)diazomethane; and allyl-substituted sulfonyldiazomethane compounds such as
   bis(phenylsulfonyl)diazomethane,
bis(4-methylphenylsulfonyl)diazomethane,
bis(2,4-dimethylphenylsulfonyl)diazomethane,
bis(2-naphthylsulfonyl)diazomethane, and
tert-butoxycarbonyl-4-methylphenylsulfonyldiazomethane.

Sulfone photoacid generators include
bis(phenylsulfonyl)methane,
bis(4-methylphenylsulfonyl)methane,
bis(2-naphthylsulfonyl)methane,
2,2-bis(phenylsulfonyl)propane,
2,2-bis(4-methylphenylsulfonyl)propane,
2,2-bis(2-naphthylsulfonyl)propane,
2-methyl-2-(p-toluenesulfonyl)propiophenone,
2-cyclohexylcarbonyl-2-(p-toluenesulfonyl)propane, and
2,4-dimethyl-2-(p-toluenesulfonyl)pentan-3-one.

Photoacid generators in the form of glyoxime derivatives are as described in Japanese Patent No. 2,906,999 and JP-A 9-301948. Examples include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-trifluoromethylbenzenesulfonyl)-α-dimethylglyoxime,
bis-O-(xylenesulfonyl)-α-dimethylglyoxime,
bis-O-(trifluoromethanesulfonyl)-nioxime,
bis-O-(2,2,2-trifluoroethanesulfonyl)-nioxime,
bis-O-(10-camphorsulfonyl)-nioxime,
bis-O-(benzenesulfonyl)-nioxime,
bis-O-(p-fluorobenzenesulfonyl)-nioxime,
bis-O-(p-trifluoromethylbenzenesulfonyl)-nioxime, and
bis-O-(xylenesulfonyl)-nioxime.

Also the oxime sulfonates described in U.S. Pat. No. 6,004,724 are less preferred, for example,
(5-(4-toluenesulfonyl)oxyimino-5H-thiophen-2-ylidene) phenyl-acetonitrile,
(5-(10-camphorsulfonyl)oxyimino-5H-thiophen-2-ylidene) phenyl-acetonitrile,
(5-n-octanesulfonyloxyimino-5H-thiophen-2-ylidene)phenyl-acetonitrile,
(5-(4-toluenesulfonyl)oxyimino-5H-thiophen-2-ylidene)(2-methylphenyl)acetonitrile,
(5-(10-camphorsulfonyl)oxyimino-5H-thiophen-2-ylidene) (2-methylphenyl)acetonitrile,
(5-n-octanesulfonyloxyimino-5H-thiophen-2-ylidene)(2-methylphenyl)acetonitrile, etc.

Also less preferred are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphoryl-sulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethylphenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methylsulfonate; 2,2,2-trifluoro-1-(2-methylphenyl)-ethanone oxime-O-(10-camphoryl)sulfonate; 2,2,2-trifluoro-1-(2,4-dimethylphenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethylphenyl)-ethanone oxime-O-(10-camphoryl) sulfonate; 2,2,2-trifluoro-1-(2,4,6-trimethylphenyl)-ethanone oxime-O-(1-naphthyl)sulfonate; 2,2,2-trifluoro-1-(2,4,6-trimethylphenyl)-ethanone oxime-O-(2-naphthyl) sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methylsulfonate; 2,2,2-trifluoro-1-(4-methoxyphenyl)-ethanone oxime-O-(4-methylphenyl)sulfonate; 2,2,2-trifluoro-1-(4- methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethyl-phenyl)-ethanone oxime-O-(4-methoxyphenyl)sulfonate; 2,2,2-trifluoro-1-(4-thiomethylphenyl)-ethanone oxime-O-(4-dodecylphenyl)sulfonate; 2,2,2-trifluoro-1-(4-thiomethyl-phenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl)sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methylsulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propyl-sulfonate; 2,2,2-trifluoro-1-[4-methylsulfonylphenyl]-ethanone oxime-O-propylsulfonate; 1,3-bis[1-(4-phenoxyphenyl)-2,2,2-trifluoroethanone oxime-O-sulfonyl]phenyl; 2,2,2-trifluoro-1-[4-methylsulfonyl-oxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propylsulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxyphenyl]-ethanone oxime-O-propylsulfonate; 2,2,2-trifluoro-1-[2-thiophenyl]-ethanone oxime-O-propylsulfonate; and 2,2,2-trifluoro-1-[1-dioxathiophen-2-yl)]-ethanone oxime-O-propylsulfonate.

Further, the oxime sulfonates described in JP-A9-95479 and JP-A 9-230588 and the references cited therein are less preferred, for example,
α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Bisoxime sulfonates include those described in JP-A9-208554, for example,
bis(α-(4-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(4-toluenesulfonyloxy)imino)-p-phenylenediacetonitrile,
bis(α-(trifluoromethanesulfonyloxy)imino)-p-phenylenediaceto-nitrile,
bis(α-(4-methoxybenzenesulfonyloxy)imino)-p-phenylenediaceto-nitrile,
bis(α-(4-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(4-toluenesulfonyloxy)imino)-m-phenylenediacetonitrile,
bis(α-(trifluoromethanesulfonyloxy)imino)-m-phenylenediaceto-nitrile,
bis(α-(4-methoxybenzenesulfonyloxy)imino)-m-phenylenediaceto-nitrile, etc.

In contrast, as mentioned above, the organic acid generator of formula (4) has an appropriate sensitivity even when used alone and takes to the full extent the advantage of organic acid generators that pattern side walls can be smoothly finished without generating a T-top profile. Thus the organic acid generator of formula (4) may be used either alone or in combination with organic acid generators of different types as described above.

Of the acid generators which can be used in combination with the organic acid generator of formula (4), most preferred are onium salts. An optimum combination of the organic acid generator of formula (4) with an onium salt should be determined by taking into account such factors as sensitivity, pattern profile and resolution. Of a variety of onium salts, sulfonium salts and iodonium salts are useful acid generators.

Sulfonium salts are salts of sulfonium cations with sulfonates. Exemplary sulfonium cations include substituted or unsubstituted triphenyl sulfoniums such as triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium; substituted or unsubstituted allyl sulfoniums such as 2-naphthyldiphenylsulfonium, dimethyl-2-naphthylsulfonium; and sulfoniums having a non-aromatic substituent group, such as 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, and 2-oxo-2-phenylethylthiacyclopentanium.

Exemplary sulfonates include sulfonates in which carbon in proximity to the sulfonyl group is substituted with fluorine, such as trifluoromethanesulfonate, nonafluorobutanesulfonate, heptadecafluorooctanesulfonate, 2,2,2-trifluoroethanesulfonate, perfluoro-4-ethylcyclohexanesulfonate, and pentafluorobenzenesulfonate; aromatic sulfonates such as 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, and naphthalenesulfonate; and alkylsulfonates such as camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary are combinations of aryliodonium cations such as diphenyliodinium, bis(4-tert-butylphenyl)iodonium, 4-tert-butoxyphenylphenyliodonium, and 4-methoxyphenylphenyliodonium with the foregoing sulfonates.

Of these, most preferred photoacid generators are sulfonium salts. The cation is typically selected from those cations having a high sensitivity and acceptable stability such as triphenylsulfonium, 4-methylphenyldiphenylsulfonium, 4-tert-butoxyphenyldiphenylsulfonium, 4-tert-butylphenyldiphenylsulfonium, tris(4-tert-butylphenyl)sulfonium, 4-alkoxynaphthyltetrahydrothiophenium, phenacyldiphenylsulfonium, and phenacyltetrahydrothiophenium. The anion is typically selected from sulfonic acids in which a carbon atom proximate to a sulfonyl group is fluorinated such as perfluorobutanesulfonate, perfluorooctanesulfonate and perfluoro-4-ethylcyclohexanesulfonate, because they offer a high resolution.

In the resist composition of the invention, the photoacid generator may be added in any desired amount, typically from 0.3 to 10 parts, preferably from 0.5 to 5 parts by weight, per 100 parts by weight of the polysiloxane (A). Excessive amounts of the photoacid generator may degrade resolution and give rise to a problem of foreign matter during development and resist peeling. The photoacid generator of formula (4) may be used alone or in admixture with another photoacid generator. To fully attain the objects of the invention, the photoacid generator of formula (4) should preferably account for 20 to 100% by weight, more preferably 50 to 100% by weight of the total photoacid generators. It is also possible to use a photoacid generator having a low transmittance at the exposure wavelength in a controlled amount so as to adjust the transmittance of a resist coating.

Component (C) in the resist composition is an organic nitrogen-containing compound. In the resist composition, one or more organic nitrogen-containing compounds may be compounded. The organic nitrogen-containing compound is compounded for the purpose of suppressing the rate of diffusion when the acid generated by the photoacid generator diffuses within the resist film. It is effective for improving resolution, suppressing changes in sensitivity following exposure and reducing substrate and environment dependence, as well as improving the exposure latitude and the pattern profile.

Examples of organic nitrogen-containing compounds or basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (C)-1 may also be included alone or in admixture.

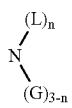

(C)-1

In the formula, n is equal to 1, 2 or 3; side chain G is independently hydrogen or a straight, branched or cyclic $C_1$-$C_{20}$ alkyl group which may contain an ether or hydroxyl group; and side chain L is independently selected from groups of the following general formulas (L)-1 to (L)-3, and two or three L's may bond together to form a ring.

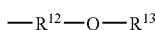

(L)-1

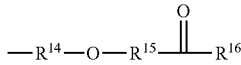

(L)-2

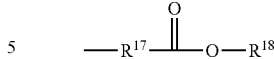

(L)-3

In the formulas, $R^{12}$, $R^{14}$ and $R^{17}$ are independently straight or branched $C_1$-$C_4$ alkylene groups; $R^{13}$ and $R^{16}$ are independently hydrogen or straight, branched or cyclic $C_1$-$C_{20}$ alkyl groups, which may contain at least one hydroxyl, ether, ester group or lactone ring; $R^{15}$ is a single bond or a straight or branched $C_1$-$C_4$ alkylene group; and $R^{18}$ is hydrogen or a straight, branched or cyclic $C_1$-$C_{20}$ alkyl group, which may contain at least one hydroxyl, ether, ester group or lactone ring.

Illustrative examples of the compounds of formula (C)-1 include tris(2-methoxymethoxyethyl)amine,
tris{2-(2-methoxyethoxy)ethyl}amine,
tris{2-(2-methoxyethoxymethoxy)ethyl}amine,
tris{2-(1-methoxyethoxy)ethyl}amine,
tris{2-(1-ethoxyethoxy)ethyl}amine,
tris{2-(1-ethoxypropoxy)ethyl}amine,
tris[2-{2-(2-hydroxyethoxy)ethoxy}ethyl]amine,
4,7,13,16,21,24-hexaoxa-1,10-diazabicyclo[8.8.8]hexacosane,
4,7,13,18-tetraoxa-1,10-diazabicyclo[8.5.5]eicosane,
1,4,10,13-tetraoxa-7,16-diazabicyclboctadecane,
1-aza-12-crown-4,1-aza-15-crown-5,1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine,
tris(2-methoxycarbonyloxyethyl)amine,
tris(2-tert-butoxycarbonyloxyethyl)amine,
tris[2-(2-oxopropoxy)ethyl]amine,
tris[2-(methoxycarbonylmethyl)oxyethyl]amine,
tris[2-(tert-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N,N-bis(2-hydroxyethyl)-2-(methoxycarbonyl)ethylamine,
N,N-bis(2-acetoxyethyl)-2-(methoxycarbonyl)ethylamine,
N,N-bis(2-hydroxyethyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl)ethylamine,
N,N-bis(2-acetoxyethyl)-2-(2-methoxyethoxycarbonyl)ethylamine,
N,N-bis(2-hydroxyethyl)-2-(2-hydroxyethoxycarbonyl)ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxy-carbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)-ethylamine,
N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbdnyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

Also useful are one or more basic compounds having cyclic structure represented by the following general formula (C)-2.

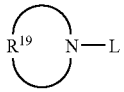

(C)-2

Herein L is as defined above, and $R^{19}$ is a straight or branched $C_2$-$C_{20}$ alkylene group which may contain one or more carbonyl, ether, ester or sulfide groups.

Illustrative examples of the basic compounds having formula (C)-2 include 1-[2-(methoxymethoxy)ethyl]pyrrolidine,
1-[2-(methoxymethoxy)ethyl]piperidine,
4-[2-(methoxymethoxy)ethyl]morpholine,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
2-(1-pyrrolidinyl)ethyl acetate, 2-piperidinoethyl acetate,
2-morpholinoethyl acetate, 2-(1-pyrrolidinyl)ethyl formate,
2-piperidinoethyl propionate,
2-morpholinoethyl acetoxyacetate,
2-(1-pyrrolidinyl)ethyl methoxyacetate,
4-[2-(methoxycarbonyloxy)ethyl]morpholine,
1-[2-(t-butoxycarbonyloxy)ethyl]piperidine,
4-[2-(2-methoxyethoxycarbonyloxy)ethyl]morpholine,
methyl 3-(1-pyrrolidinyl)propionate,
methyl 3-piperidinopropionate, methyl 3-morpholinopropibnate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate,
butyl 3-morpholinopropionate,
cyclohexyl 3-piperidinopropionate,
α-(1-pyrrolidinyl)methyl-γ-butyrolactone,
β-piperidino-γ-butyrolactone, β-morpholino-δ-valerolactone,
methyl 1-pyrrolidinylacetate, methyl piperidinoacetate,
methyl morpholinoacetate, methyl thiomorpholinoacetate,
ethyl 1-pyrrolidinylacetate, and
2-methoxyethyl morpholinoacetate.

Also, one or more basic compounds having cyano group represented by the following general formulae (C)-3 to (C)-6 may be blended.

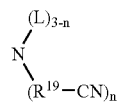

(C)-3

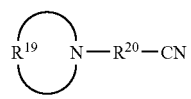

(C)-4

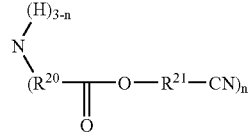

(C)-5

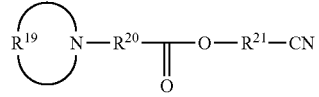

(C)-6

Herein, L, $R^{19}$ and n are as defined above, and $R^{20}$ and $R^{21}$ are each independently a straight or branched $C_1$-$C_4$ alkylene group.

Illustrative examples of the basic compounds having cyano represented by formulae (C)-3 to (C)-6 include
3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile,
methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile, N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiono-nitrile,
N-(2-cyanoethyl)-N-(3-hydroxy-1-propyl)-3-aminopropiononitrile,
N-(3-acetoxy-1-propyl)-N-(2-cyanoethyl)-3-aminopropiononitrile,
N-(2-cyanoethyl)-N-(3-formyloxy-1-propyl)-3-aminopropiono-nitrile,
N-(2-cyanoethyl)-N-tetrahydrofurfuryl-3-aminopropiononitrile,
N,N-bis(2-cyanoethyl)-3-aminopropionitrile, diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopropionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl]aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile, 1-piperidinepropiononitrile,
4-morpholinepropiononitrile, 1-pyrrolidineacetonitrile,
1-piperidineacetonitrile, 4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

Also included are organic nitrogen-containing compounds having an imidazole structure and a polar functional group, represented by the general formula (C)-7.

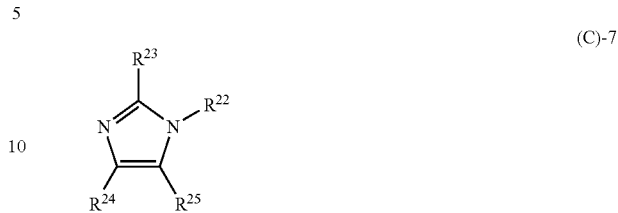

(C)-7

Herein, $R^{22}$ is a straight, branched or cyclic $C_2$-$C_{20}$ alkyl group bearing at least one polar functional group selected from among hydroxyl, carbonyl, ester, ether, sulfide, carbonate, cyano and acetal groups; $R^{23}$, $R^{24}$ and $R^{25}$ are each independently a hydrogen atom, a straight, branched or cyclic alkyl, aryl or aralkyl group having 1 to 10 carbon atoms.

Also included are organic nitrogen-containing compounds having a benzimidazole structure and a polar functional group, represented by the general formula (C)-8.

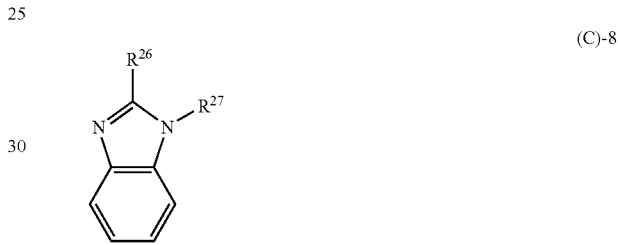

(C)-8

Herein, $R^{26}$ is a hydrogen atom, a straight, branched or cyclic alkyl, aryl or aralkyl group having 1 to 10 carbon atoms. $R^{27}$ is a polar functional group-bearing, straight, branched or cyclic $C_1$-$C_{20}$ alkyl group, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (C)-9 and (C)-10.

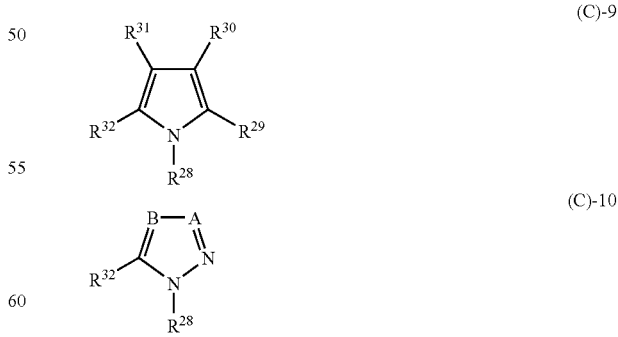

(C)-9

(C)-10

Herein, A is a nitrogen atom or C-$R^{34}$, B is a nitrogen atom or C-$R^{35}$, $R^{28}$ is a straight, branched or cyclic $C_2$-$C_{20}$ alkyl group bearing at least one polar functional group selected from among hydroxyl, carbonyl, ester, ether, sulfide, carbonate, cyano and acetal groups; $R^{29}$, $R^{30}$, $R^{31}$ and $R^{32}$ are each independently a hydrogen atom, a straight, branched or cyclic alkyl group or aryl group having 1 to 10 carbon atoms, or a pair of $R^{29}$ and $R^{30}$ and a pair of $R^{31}$ and $R^{32}$, taken together, may form a benzene, naphthalene or pyridine ring; $R^{33}$ is a hydrogen atom, a straight, branched or cyclic alkyl group or aryl group having 1 to 10 carbon atoms; $R^{34}$ and $R^{35}$ each are a hydrogen atom, a straight, branched or cyclic alkyl group or aryl group having 1 to 10 carbon atoms, or a pair of $R^{33}$ and $R^{35}$, taken together, may form a benzene or naphthalene ring.

The organic nitrogen-containing compound or basic compound (C) is preferably formulated in an amount of 0.001 to 2 parts, and especially 0.01 to 1 part by weight, per 100 parts by weight of the base resin (A). Less than 0.001 part of the nitrogen-containing compound achieves no or little addition effect whereas more than 2 parts would result in too low a sensitivity.

Component (D) in the resist composition of the invention is an organic solvent. The organic solvent used herein may be any organic solvent in which the base resin or solids, photoacid generator, and other components are soluble.

Illustrative, non-limiting, examples of the organic solvent include ketones such as cyclohexanone and methyl 2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl-acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, or a mixture thereof because the photoacid generator is most soluble therein.

An appropriate amount of the organic solvent used is about 500 to 1,500 parts, especially about 800 to 1,500 parts by weight per 100 parts by weight of the solids in the resist composition.

In the resist composition of the invention, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl 2-methyl-2-tosyloxymethylacetoacetate and 2-phenyl 2-(2-tosyloxyethyl)-1,3-dioxolane, but are not limited thereto. Of well-known photoacid generators, many of those compounds having poor stability, especially poor thermal stability exhibit an acid-amplifier compound-like behavior.

In the resist composition of the invention, an appropriate amount of the acid-amplifier compound is up to 2 parts, and especially up to 1 part by weight per 100 parts by weight of the base resin (A). Excessive amounts of the acid-amplifier compound makes diffusion control difficult, leading to degradation of resolution and pattern profile.

The resist composition of the invention may additionally include an acetylene alcohol derivative for the purpose of enhancing the shelf stability. Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K. They are polyalkylene oxide alcohol derivatives having an acetylene skeleton within the molecule.

The acetylene alcohol derivative is desirably added in an amount of 0 to 2% by weight, preferably 0.01 to 2% by weight, and more preferably 0.02 to 1% by weight, based on the resist composition. More than 2% by weight would result in a resist having a low resolution.

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Fluorad FC-430 from Sumitomo 3M, Ltd., KH-20 and KH-30 from Asahi Glass Co., Ltd., and X-70-093 from Shin-Etsu Chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for 30 seconds to 5 minutes. A patterning mask having the desired pattern is then placed over the resist film, and the film exposed through the mask to an electron beam or to high-energy radiation having a wavelength of up to 300 nm such as deep-UV radiation, excimer laser radiation or x-ray in a dose of about 1 to 200 mJ/cm$^2$, and preferably about 10 to 100 mJ/cm$^2$. The resist film is then post-exposure baked (PEB) on a hot plate at 60 to 150° C. for 10 seconds to 5 minutes, and preferably at 80 to 130° C. for 30 seconds to 3 minutes. Finally, development is carried out using as the developer an aqueous alkali solution, such as a 0.1 to 5 wt % (preferably 2 to 3 wt %) aqueous solution of tetramethylammonium hydroxide (TMAH), this being done by a conventional method such as dip, puddle, or spray development for a period of 10 seconds to 3 minutes, and preferably 30 seconds to 2 minutes. These steps result in the formation of the desired pattern on the substrate. Of the various types of high-energy radiation that may be used, the resist composition of the invention is best suited to fine pattern formation with deep-UV radiation or excimer laser radiation having a wavelength of 254 to 120 nm, specifically excimer lasers such as KrF (248 nm), ArF (193 nm), Kr$_2$ (146 nm), and KrAr (134 nm), and lasers such as F$_2$ (157 nm) and Ar$_2$ (126 nm), x-rays, or electron beams. The invention is applicable to not only dry light exposure, but also light exposure by the immersion process.

Described below is a method of processing a substrate using the resist composition according to the bilayer resist process. A substrate to be processed is usually an inorganic substrate. An underlying film (or organic film) is formed on the substrate. The resist composition of the invention is applied onto the underlying film to form a resist coating. If necessary, an antireflective coating may be formed between the resist composition and the underlying film. The resist coating is patterned by the above-mentioned procedure, after which the pattern is transferred to the underlying film by oxygen gas etching using the resist pattern as an etching mask. The oxygen gas etching is reactive plasma etching using oxygen gas as a main component. With this method, silicon oxide having high resistance to oxygen gas etching is formed from the resist pattern, allowing the underlying organic film to be processed at a high aspect ratio. $SO_2$, $CO_2$, CO, $NH_3$ or $N_2$ gas may be added to the oxygen gas for protecting side walls for preventing the film from being configured to a T-top profile by over-etching. Prior to the oxygen gas etching, brief etching with a fluorocarbon gas may be carried out for removing any scum of the resist after development and smoothening line edges to prohibit roughening. If the resist composition contains much fluorine, the selective ratio of oxygen gas etching relative to the organic film becomes lower, indicating the difficulty of processing at a high aspect ratio. Under such a situation, the resist design of the present invention is useful.

Subsequently, the processable film or substrate is subjected to dry etching. Etching with a fluorocarbon gas as a main component is carried out when the processable film is $SiO_2$ or $Si_3N_4$. Exemplary fluorocarbon gases are $CF_4$, $CHF_3$, $CH_2F_2$, $C_2F_6$, $C_3F_8$, $C_4F_{10}$ and $C_5F_{12}$. At the same time as the dry etching of the processable film, the silicon-containing resist film can be stripped off. Etching with chlorine or bromine gas as a main component is employed when the processable film is polysilicon, tungsten silicide, TiN/Al or the like.

In the bilayer resist process, the underlying film may be made of any organic material which is selected from a number of well-known organic film materials. As the organic film, aromatic resins are generally preferred, with those aromatic resins which can be crosslinked during film formation so as to prevent intermixing during coating and film formation of the resist composition thereon being especially preferred.

Suitable aromatic resins include novolak resins and polyhydroxystyrene resins. Aromatic resins further having a fluorene or indene skeleton are advantageously used to enhance the etching resistance of the organic film during etching of the substrate after the pattern has been transferred to the organic film. It is possible to form an antireflective coating on the organic film and to form a resist film of the invention thereon. If the organic film possesses an antireflective function, advantageously the overall process becomes simpler. To impart an antireflective function, an aromatic resin having an anthracene skeleton or naphthalene skeleton or benzene skeleton having a conjugated unsaturated bond is preferably used.

Crosslinks can be formed by a crosslinking method as employed for thermosetting resins and negative resist compositions. In general, a composition solution comprising a resin having functional groups such as phenol, alkoxyphenyl, alcohol or carboxylic acid, a material capable of thermal decomposition to generate an acid, and a crosslinker capable of forming crosslinks with the functional groups in the presence of an acid catalyst, such as hexaalkoxymethylmelamine is applied onto a processable substrate, and the coating is heated to generate an acid, with which crosslinks are formed.

EXAMPLE

Synthesis Examples and Examples are given below together with Comparative Examples for further illustrating the invention although the invention is not limited thereby. The abbreviations used herein are GPC for gel permeation chromatography, NMR for nuclear magnetic resonance, and Mw for weight average molecular weight.

Synthesis Example 1

Synthesis of Polymer 1

A 200-ml four-necked flask equipped with a stirrer, reflux condenser, dropping funnel and thermometer was charged with 0.2 g of acetic acid, 20 g of water, and 20 g of ethanol and kept at 30° C. To the flask, a solution of 10.8 g (30 mmol) triethoxysilane (A), 8.8 g (20 mmol) triethoxysilane (B) and 16.4 g (50 mmol) triethoxysilane (C) in 40 g ethanol was added dropwise over 3 hours.

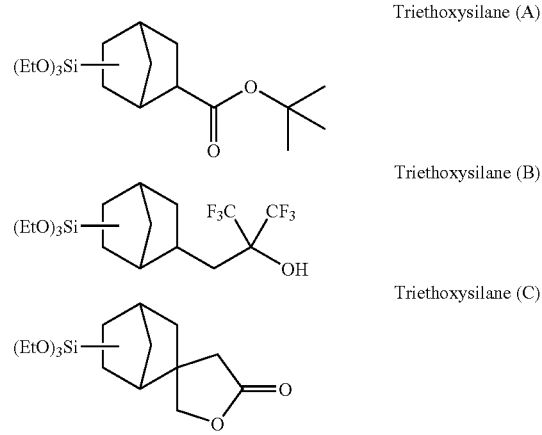

It is noted that Et is ethyl.

Subsequently the reaction mixture was ripened at 30° C. for 20 hours. The reaction mixture was repeatedly diluted with methyl isobutyl ketone and washed with water until the organic layer became neutral. It was concentrated, obtaining 27.6 g of an oligomer.

Using 50 g of toluene, the oligomer was transferred to a 100-ml three-necked flask equipped with a stirrer, reflux condenser, and thermometer. Potassium hydroxide, 56 mg, was added to the solution, which was heated under reflux over 20 hours. After cooling, the reaction solution was repeatedly diluted with methyl isobutyl ketone and washed with water until the organic layer became neutral. It was concentrated, obtaining 24.9 g of a polymer.

On analysis by NMR and GPC, the polymer, designated Polymer 1, was identified to be a polysiloxane compound consisting of structural units 1, 4 and 6 (shown later) and having a Mw of 3,500.

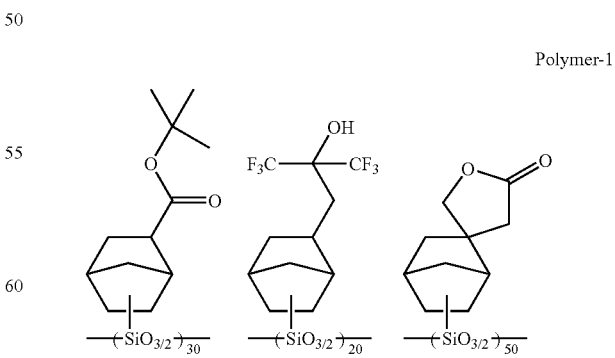

In the structure like the foregoing ethoxysilane compounds, a variety of ethoxysilane compounds are derivable by changing the structure of substituent group bonded to silicon.

Synthesis Example 2

Synthesis of Polymers 2 to 17

Polysiloxane compounds, designated Polymers 2 to 17, were produced by the same procedure as Synthesis Example 1. Their yield, results of NMR and GPC analyses, and Mw are shown in table 1.

TABLE 1

| Polymer | Structural units and their proportion (mol %) | | | | Yield (g) | Mw |
|---|---|---|---|---|---|---|
| Polymer 1 | Unit 1 30 | Unit 4 20 | Unit 6 50 | | 24.9 | 3,500 |
| Polymer 2 | Unit 2 20 | Unit 4 20 | Unit 6 60 | | 25.6 | 3,550 |
| Polymer 3 | Unit 3 25 | Unit 4 20 | Unit 6 55 | | 25.8 | 3,300 |
| Polymer 4 | Unit 1 30 | Unit 5 20 | Unit 6 50 | | 24.6 | 3,600 |
| Polymer 5 | Unit 1 30 | Unit 4 30 | Unit 7 40 | | 26.0 | 2,400 |
| Polymer 6 | Unit 1 30 | Unit 4 20 | Unit 6 25 | Unit 7 25 | 25.3 | 2,700 |
| Polymer 7 | Unit 1 25 | Unit 4 15 | Unit 8 60 | | 24.1 | 3,700 |
| Polymer 8 | Unit 1 30 | Unit 4 20 | Unit 9 50 | | 24.3 | 3,450 |
| Polymer 9 | Unit 3 25 | Unit 4 20 | Unit 9 55 | | 25.2 | 3,300 |
| Polymer 10 | Unit 3 30 | Unit 5 20 | Unit 9 50 | | 24.7 | 3,350 |
| Polymer 11 | Unit 1 20 | Unit 4 40 | Unit 10 40 | | 24.6 | 3,000 |
| Polymer 12 | Unit 3 40 | Unit 4 10 | Unit 10 50 | | 25.3 | 3,700 |
| Polymer 13 | Unit 1 20 | Unit 4 10 | Unit 6 30 | Unit 11 40 | 17.1 | 6,500 |
| Polymer 14 | Unit 1 30 | Unit 4 30 | Unit 8 30 | Unit 11 10 | 23.5 | 4,000 |
| Polymer 15 | Unit 3 20 | Unit 5 15 | Unit 9 45 | Unit 11 20 | 21.1 | 4,200 |
| Polymer 16 | Unit 1 20 | Unit 4 80 | | | 31.8 | 3,000 |
| Polymer 17 | Unit 1 30 | Unit 4 20 | Unit 12 50 | | 24.0 | 3,600 |

Structural unit 1

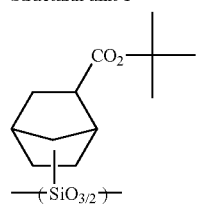

Structural unit 2

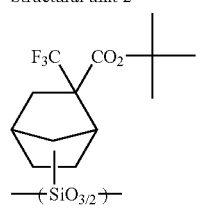

Structural unit 3

Structural unit 4

Structural unit 5

Structural unit 6

Structural unit 7

Structural unit 8

Structural unit 9

TABLE 1-continued

| Polymer | Structural units and their proportion (mol %) | Yield (g) | Mw |
|---|---|---|---|

Structural unit 10

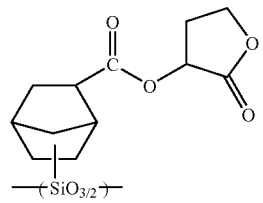

Structural unit 11

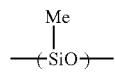

Structural unit 12

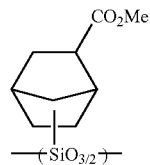

It is noted that Me is methyl.

Resolution Evaluation

[Resist Preparation]

A positive resist-forming coating solution was prepared by dissolving each of the polysiloxane compounds synthesized above (Polymers 1 to 17), a photoacid generator (PAG1 to PAG5), a basic compound (tributylamine), and a surfactant (KH-20 by Asahi Glass Co., Ltd.) in propylene glycol monomethyl ether acetate (PGMEA) according to the recipe shown in Tables 2 and 3, followed by filtration through a filter having a pore diameter of 0.2 μm.

PAG1

PAG2

PAG3

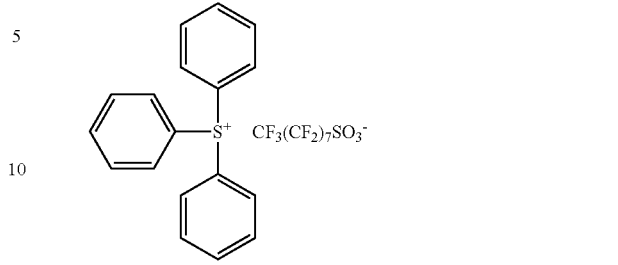

PAG4

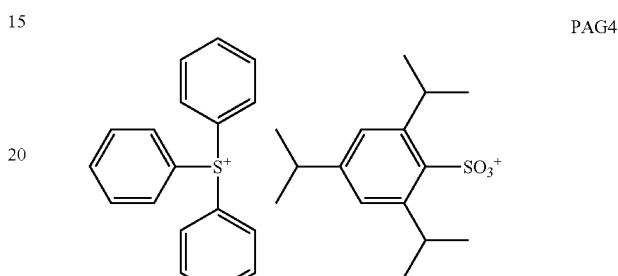

PAG5

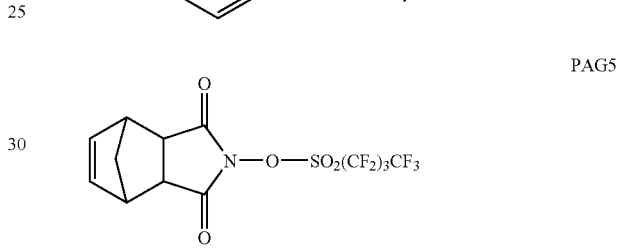

Using a spin coater, the resist solution was applied to a silicon wafer having a 55-nm antireflective coating of DUV-30J (Nissan Chemical Industries, Ltd.) formed thereon, and baked at 110° C. for 90 seconds to form a resist film of 150 nm thick. The resist film was exposed using an ArF excimer laser scanner NSR-S305B (Nikon Corporation; NA 0.68, σ 0.85, ⅔ annular illumination) equipped with a 6% halftone phase shift mask, for transferring a pattern. Following the exposure, the resist was baked (PEB) at 90° C. for 90 seconds, and developed for 60 seconds with a 2.38 wt % aqueous solution of tetramethylammonium hydroxide (TMAH), thereby giving a positive pattern.

The target pattern to be transferred by ArF exposure was a 1:1 contact hole pattern having a hole diameter of 120 nm, with a pitch of 240 nm and a mask bias of 30 nm set. That is, from the mask with pitch 960 nm and contact hole size 600 nm, holes of 120 nm were transferred onto the resist through ¼ shrink exposure with the settings: 240 nm pitch and 30 nm mask bias.

The sensitivity at which the 120-nm contact hole pattern could be formed was determined. The pattern profile was observed under a scanning electron microscope S4700H (Hitachi, Ltd.) for section inspection. It was determined whether the pattern was degraded by extension of the top of the contact hole pattern (T-top profiled) and the roughness of sidewalls was confirmed. The resolution is the minimum contact hole size which can be resolved at the sensitivity that ensures formation of the 120-nm contact hole pattern.

The formulation of resist compositions and their evaluation results are shown in Tables 2 and 3.

TABLE 2

| | Polymer (pbw) | Acid generator 1 (pbw) | Acid generator 2 (pbw) | Basic compound (pbw) | Surfactant (pbw) | Solvent (pbw) | Sensitivity (mJ/cm$^2$) | Contact hole pattern profile | Resolution (nm) |
|---|---|---|---|---|---|---|---|---|---|
| Example 1 | Polymer-1 (100) | PAG1 (4) | — | tributylamine (0.1) | KH-20 (0.050) | PGMEA (900) | 40 | rectangular, smooth sidewalls | 115 |
| Example 2 | Polymer-2 (100) | PAG1 (4) | — | tributylamine (0.1) | KH-20 (0.050) | PGMEA (900) | 37 | rectangular, smooth sidewalls | 115 |
| Example 3 | Polymer-3 (100) | PAG1 (4) | — | tributylamine (0.1) | KH-20 (0.050) | PGMEA (900) | 34 | rectangular, smooth sidewalls | 100 |
| Example 4 | Polymer-4 (100) | PAG1 (4) | — | tributylamine (0.1) | KH-20 (0.050) | PGMEA (900) | 41 | rectangular, smooth sidewalls | 115 |
| Example 5 | Polymer-5 (100) | PAG1 (4) | — | tributylamine (0.1) | KH-20 (0.050) | PGMEA (900) | 41 | rectangular, smooth sidewalls | 115 |
| Example 6 | Polymer-6 (100) | PAG1 (4) | — | tributylamine (0.1) | KH-20 (0.050) | PGMEA (900) | 40 | rectangular, smooth sidewalls | 115 |
| Example 7 | Polymer-7 (100) | PAG1 (4) | — | tributylamine (0.1) | KH-20 (0.050) | PGMEA (900) | 44 | rectangular, smooth sidewalls | 115 |
| Example 8 | Polymer-8 (100) | PAG1 (4) | — | tributylamine (0.1) | KH-20 (0.050) | PGMEA (900) | 40 | rectangular, smooth sidewalls | 115 |
| Example 9 | Polymer-9 (100) | PAG1 (4) | — | tributylamine (0.1) | KH-20 (0.050) | PGMEA (900) | 35 | rectangular, smooth sidewalls | 105 |
| Example 10 | Polymer-9 (100) | PAG1 (2) | PAG2 (2) | tributylamine (0.1) | KH-20 (0.050) | PGMEA (900) | 30 | rectangular, smooth sidewalls | 100 |
| Example 11 | Polymer-9 (100) | PAG1 (2) | PAG3 (2) | tributylamine (0.1) | KH-20 (0.050) | PGMEA (900) | 32 | rectangular, smooth sidewalls | 105 |
| Example 12 | Polymer-10 (100) | PAG1 (4) | — | tributylamine (0.1) | KH-20 (0.050) | PGMEA (900) | 32 | rectangular, smooth sidewalls | 105 |
| Example 13 | Polymer-10 (100) | PAG1 (2) | PAG2 (2) | tributylamine (0.1) | KH-20 (0.050) | PGMEA (900) | 33 | rectangular, smooth sidewalls | 105 |
| Example 14 | Polymer-11 (100) | PAG1 (4) | — | tributylamine (0.1) | KH-20 (0.050) | PGMEA (900) | 40 | rectangular, smooth sidewalls | 115 |
| Example 15 | Polymer-12 (100) | PAG1 (4) | — | tributylamine (0.1) | KH-20 (0.050) | PGMEA (900) | 42 | rectangular, smooth sidewalls | 110 |
| Example 16 | Polymer-12 (100) | PAG1 (2) | PAG2 (2) | tributylamine (0.1) | KH-20 (0.050) | PGMEA (900) | 35 | rectangular, smooth sidewalls | 105 |
| Example 17 | Polymer-13 (100) | PAG1 (4) | — | tributylamine (0.1) | KH-20 (0.050) | PGMEA (900) | 41 | rectangular, smooth sidewalls | 115 |
| Example 18 | Polymer-14 (100) | PAG1 (4) | — | tributylamine (0.1) | KH-20 (0.050) | PGMEA (900) | 44 | rectangular, smooth sidewalls | 115 |
| Example 19 | Polymer-15 (100) | PAG1 (4) | — | tributylamine (0.1) | KH-20 (0.050) | PGMEA (900) | 36 | rectangular, smooth sidewalls | 100 |
| Example 20 | Polymer-15 (100) | PAG1 (2) | PAG2 (2) | tributylamine (0.1) | KH-20 (0.050) | PGMEA (900) | 34 | rectangular, smooth sidewalls | 100 |
| Example 21 | Polymer-15 (100) | PAG1 (2) | PAG3 (2) | tributylamine (0.1) | KH-20 (0.050) | PGMEA (900) | 36 | rectangular, smooth sidewalls | 105 |
| Example 22 | Polymer-16 (100) | PAG1 (4) | — | tributylamine (0.1) | KH-20 (0.050) | PGMEA (900) | 50 | some T-top smooth sidewalls | 110 |
| Example 23 | Polymer-17 (100) | PAG1 (4) | — | tributylamine (0.1) | KH-20 (0.050) | PGMEA (900) | 52 | some T-top smooth sidewalls | 120 |

TABLE 3

| | Polymer (pbw) | Acid generator 1 (pbw) | Acid generator 2 (pbw) | Basic compound (pbw) | Surfactant (pbw) | Solvent (pbw) | Sensitivity (mJ/cm$^2$) | Contact hole pattern profile | Resolution (nm) |
|---|---|---|---|---|---|---|---|---|---|
| Comparative Example 1 | Polymer-1 (100) | PAG2 (4) | — | tributylamine (0.1) | KH-20 (0.050) | PGMEA (900) | 41 | some T-top, standing waves observed | 120 |
| Comparative Example 2 | Polymer-1 (100) | PAG2 (2) | PAG3 (2) | tributylamine (0.1) | KH-20 (0.050) | PGMEA (900) | 44 | some T-top, standing waves observed | 120 |
| Comparative Example 3 | Polymer-1 (100) | PAG2 (2) | PAG4 (2) | tributylamine (0.1) | KH-20 (0.050) | PGMEA (900) | 52 | T-top, roughening by standing waves | 120 |
| Comparative Example 4 | Polymer-4 (100) | PAG2 (4) | — | tributylamine (0.1) | KH-20 (0.050) | PGMEA (900) | 39 | some T-top, standing waves observed | 120 |
| Comparative Example 5 | Polymer-4 (100) | PAG2 (2) | PAG3 (2) | tributylamine (0.1) | KH-20 (0.050) | PGMEA (900) | 40 | some T-top, standing waves observed | 120 |
| Comparative Example 6 | Polymer-4 (100) | PAG2 (2) | PAG4 (2) | tributylamine (0.1) | KH-20 (0.050) | PGMEA (900) | 44 | T-top, roughening by standing waves | 120 |
| Comparative Example 7 | Polymer-4 (100) | PAG5 (4) | — | tributylamine (0.1) | KH-20 (0.050) | PGMEA (900) | 120 | marked T-top | nm not resolved |
| Comparative Example 8 | Polymer-4 (100) | PAG5 (2) | PAG2 (2) | tributylamine (0.1) | KH-20 (0.050) | PGMEA (900) | 120 | marked T-top | nm not resolved |

As is evident from Examples in Table 2, in all the resist compositions using various polysiloxane compounds, the use of organic acid generator PAG1 affords advantages including development of no T-top, minimized roughness on sidewalls of contact holes, and good resolution. By contrast, Comparative Examples in Table 3 demonstrate that when onium salts are used alone, both a T-top profile and the roughness of sidewalls attributable to standing waves are observable, and that when organic acid generator PAG5 was used, a marked T-top profile was observed and the target contact holes could not be resolved.

A comparison in critical resolution among polymers shows that a high critical resolution is achievable with polymers having a lactone skeleton and polymers having only fluorinated alcohol, and that polymers having a lactone ring bonded directly to a cycloaliphatic structure provide a higher resolution than polymers having a chain-like linker.

[Etching Test]

A positive resist-forming coating solution was prepared by dissolving 100 parts by weight of a polysiloxane (Polymer 1 or 4), 4.0 parts by weight of acid generator PAG1, 0.2 part by weight of triethanolamine, and 0.1 part by weight of a surfactant X-70-093 (Shin-Etsu Chemical Co., Ltd.) in 900 parts by weight of PGMEA, followed by filtration through a filter having a pore diameter of 0.2 µm. The resist solution was spin coated onto a silicon wafer and baked at 110° C. for 90 seconds to form a resist film of 200 nm thick. The wafer having the resist film formed thereon was subjected to dry etching. A difference in resist film thickness before and after the etching test was determined. Using a dry etching instrument TE-8500P by Tokyo Electron K.K., the resist film was etched with oxygen gas under the conditions: chamber pressure 60 Pa, RF power 600 W, Ar gas flow rate 40 ml/min, O$_2$ gas flow rate 60 ml/min, gap 9 mm, and etching time 60 seconds. The results are shown in Table 4.

TABLE 4

| Polymer | O$_2$ gas etching rate (nm/min) |
|---|---|
| Polymer 1 | 25 |
| Polymer 4 | 28 |

Japanese Patent application No. 2004-292290 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising (A) a polysiloxane comprising structural units having the following general formulae (1), (2) and (3):

(1)

(2)

(3)

wherein $R^1$ is a $C_3$-$C_{20}$ organic group with a straight, branched, cyclic or polycyclic structure which has a hydroxyl group on a carbon atom as a functional group, which has at least 3 fluorine atoms, in total, on a carbon atom bonded to the hydroxyl-bonded carbon atom, and which may further contain a halogen, oxygen or sulfur atom, $R^2$ is a $C_1$-$C_6$ hydrocarbon group with a straight, branched or cyclic structure, $R^3$ is an $C_3$-$C_{20}$ organic group with a straight, branched, cyclic or polycyclic structure which has a carboxyl group as a functional group, said carboxyl group being protected with an acid-decomposable protecting group, and which may further contain a halogen, oxygen or sulfur atom, $R^4$ is as defined for $R^2$, $R^5$ is a $C_4$-$C_{16}$ organic group which has a lactone ring as a functional group and which may further contain a halogen, oxygen or sulfur atom, $R^6$ is as defined for $R^2$, p is 0 or 1, q is 0 or 1, r is 0 or 1, wherein the structural units having formula (2) are structural units having the following formula (6):

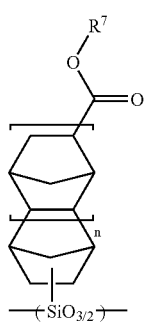

(6)

wherein $R^7$ is an acid labile group and n is an integer of 0 or 1, and wherein the structural units having formula (3) are structural units having the following formula (7) or (8), or the following structural unit 7 or 10:

(7)

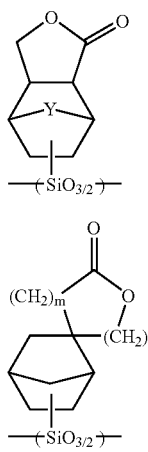

(8)

wherein Y is an oxygen atom, sulfur atom or methylene group and m is 0 or 1,

Structural unit 7

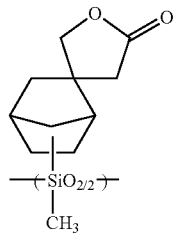

Structural unit 10

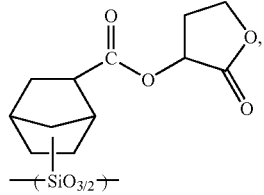

(B) an acid generator having the structural formula (4):

(4)

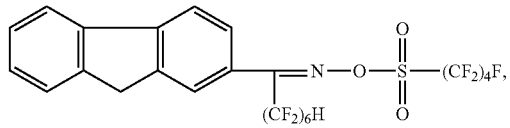

(C) a nitrogen-containing organic compound, and
(D) a solvent.

2. The resist composition of claim 1 wherein in the polysiloxane (A), the structural units having formula (1) are structural units having the following formula (5):

(5)

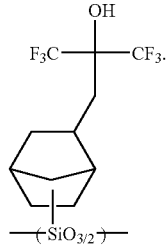

3. A patterning process comprising the steps of:
applying the resist composition of claim 1 onto a substrate to form a resist layer,
heat treating the resist layer and exposing it to a pattern of high energy radiation, and
heat treating the exposed resist layer and developing it with a developer.

4. The patterning process of claim 3, further comprising forming a resin layer on the substrate such that the resin layer is sandwiched between the substrate and the resist layer, said resin layer comprising an aromatic resin having etching resistance when the substrate is to be etched.

5. A patterning process comprising the steps of:
forming a pattern on a resin film comprising an aromatic resin, using the resist composition of claim 1, and
etching the resin film through the resulting pattern as a mask, thereby patterning the resin film.

6. The patterning process of claim 5 wherein the etching step uses a gas plasma containing oxygen.

* * * * *